(12) United States Patent
Jung et al.

(10) Patent No.: US 8,531,902 B2
(45) Date of Patent: Sep. 10, 2013

(54) SENSING CIRCUIT

(75) Inventors: Seong-Ook Jung, Seoul (KR); Jisu Kim, Seoul (KR); Kyungho Ryu, Seoul (KR); Jung Pill Kim, San Diego, CA (US); Seung H. Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 187 days.

(21) Appl. No.: 13/173,795

(22) Filed: Jun. 30, 2011

(65) Prior Publication Data

US 2013/0003447 A1 Jan. 3, 2013

(51) Int. Cl.
*G11C 7/02* (2006.01)
(52) U.S. Cl.
USPC .......................................... 365/207; 365/208
(58) Field of Classification Search
USPC ................... 365/207, 208, 189.06, 189.07
See application file for complete search history.

(56) References Cited

U.S. PATENT DOCUMENTS

| 5,751,642 | A | 5/1998 | Yoo |
| 6,038,173 | A | 3/2000 | Yero |
| 2005/0030814 | A1 | 2/2005 | Oh et al. |
| 2006/0120174 | A1 | 6/2006 | Chou et al. |
| 2006/0120175 | A1* | 6/2006 | Chou et al. ............... 365/189.06 |
| 2010/0061144 | A1* | 3/2010 | Davierwalla et al. ......... 365/158 |
| 2010/0157654 | A1 | 6/2010 | Jung et al. |
| 2011/0176350 | A1* | 7/2011 | Jung et al. ..................... 365/148 |

OTHER PUBLICATIONS

International Search Report and Written Opinion—PCT/US2012/045173—ISA/EPO—Oct. 5, 2012.

* cited by examiner

*Primary Examiner* — Vu Le
(74) *Attorney, Agent, or Firm* — Sam Talpalatsky; Nicholas J. Pauley; Joseph Agusta

(57) ABSTRACT

A circuit includes a degeneration p-channel metal-oxide-semiconductor (PMOS) transistor, a load PMOS transistor, and a clamp transistor configured to clamp a voltage applied to a resistance based memory element during a sensing operation. A gate of the load PMOS transistor is controlled by an output of a not-AND (NAND) circuit.

33 Claims, 7 Drawing Sheets

SENSING CIRCUIT

I. FIELD

The present disclosure is generally related to a sensing circuit.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

Advances in non-volatile memory technology include resistance-based memory, such as magnetic random access memory (MRAM). MRAM technology can use memory cells that include magnetic tunnel junctions (MTJs) and access transistors. A sense amplifier may be coupled to one or more cells in an array of the memory cells. The sense amplifier may "read" data stored at a resistance-based memory elements by passing a current through the resistance-based memory element to determine if the memory element has a high resistance or a low resistance. In determining the resistance, the sense amplifier may compare a voltage due to the current through the resistance-based memory element to a reference voltage to obtain a difference and the sense amplifier may amplify the compared difference. However, as memory devices become smaller, the effects of process variations increase, thereby increasing the difficulty of accurately reading the data.

III. SUMMARY

A sensing circuit includes a NAND-circuit to control a gate voltage applied to a load p-channel metal-oxide semiconductor field-effect transistor (PMOS). A first input of the NAND circuit is responsive to a control voltage. A second input of the NAND circuit is coupled to a source of the load PMOS. The source of the load PMOS is also coupled to an output of a degeneration PMOS. An output of the load PMOS is coupled to a clamp transistor configured to clamp a voltage applied to a resistance-based memory element during a sensing operation. By utilizing the degeneration PMOS and by use of the NAND circuit to control the gate voltage of the load PMOS, output resistance as well as sensing margin of the sensing circuit may be enhanced.

In a particular embodiment, a circuit includes a first degeneration PMOS transistor, a load PMOS transistor, and a clamp transistor. The clamp transistor is configured to clamp a voltage applied to a resistance based memory element during a sensing operation. A gate of the load PMOS transistor is controlled by an output of a NAND circuit having a first input responsive to a control signal and a second input coupled to a terminal of the load PMOS transistor.

In another particular embodiment, a method includes controlling a gate voltage applied to a load PMOS transistor by an output of a NAND circuit. The NAND circuit has a first input responsive to a control signal and a second input coupled to a terminal of the load PMOS transistor. The terminal of the load PMOS transistor is further coupled to an output of a first PMOS transistor. The method further includes, in response to a second control signal, providing a current to a clamp transistor via a boost transistor. The current to the clamp transistor is shut off during a sensing operation.

Particular advantages provided by at least one of the disclosed embodiments of a sensing circuit include achieving one or more of enhanced output resistance, enhanced sensing margin, and increased process variation tolerance as compared to a sensing circuit that does not utilize a degeneration PMOS and that does not control a gate voltage of a load PMOS by a NAND circuit during a sensing operation.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
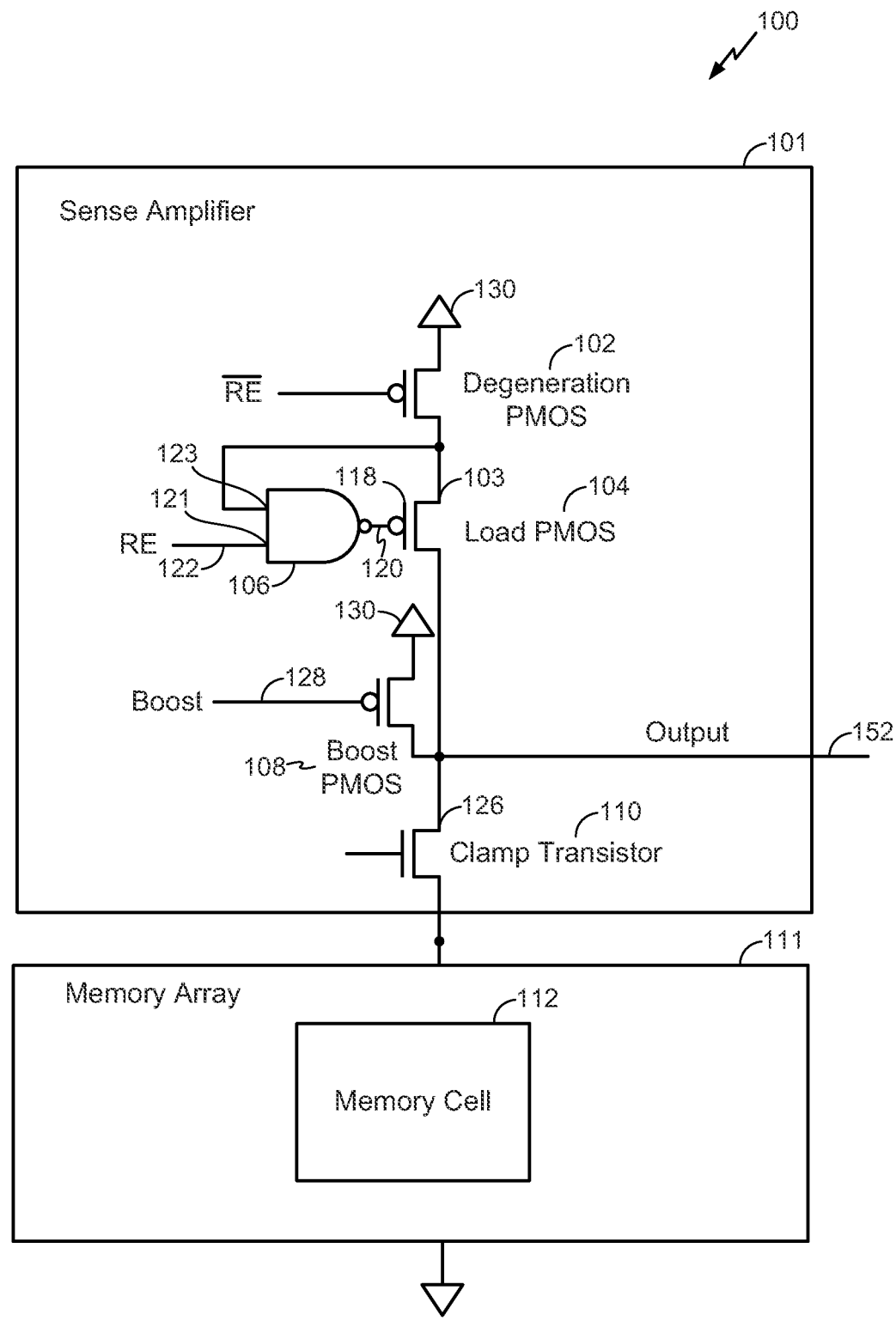
FIG. 1 is a diagram of a first illustrative embodiment of a sensing circuit.

Referring to FIG. 1, a diagram of a first illustrative embodiment of a sensing circuit is disclosed and generally designated 100. The sensing circuit 100 includes a sense amplifier 101 coupled to a memory array 111. The memory array 111 includes a plurality of memory cells such as an illustrated memory cell 112. The memory array 111 may be a magnetoresistive random access memory (MRAM), a phase-change random access memory (PRAM), or a spin torque transfer MRAM (STT-MRAM) as illustrative examples.

The sense amplifier 101 includes a degeneration PMOS transistor 102, a load PMOS transistor 104, a NAND circuit 106, a boost PMOS transistor 108, and a clamp transistor 110. The sense amplifier 101 further includes a power supply 130, and an output node 152.

A gate 118 of the load PMOS transistor 104 is controlled by an output 120 of the NAND circuit 106. The NAND circuit 106 includes a first input 121 responsive to a control signal 122 (labeled RE) and a second input 123 coupled to a terminal of the load. PMOS transistor 104. In a particular embodiment, the second input 123 of the NAND circuit 106 is responsive to a source terminal 103 of the load PMOS transistor 104. In this arrangement, a feedback loop from the load PMOS transistor 104 via the source terminal 103 is provided to the second input 123 of the NAND circuit 106.

The boost PMOS transistor 108 is supplied by the power supply 130 and is controlled at a gate by a second control signal 128 (labeled Boost). The boost PMOS transistor 108 is coupled between the power supply 130 and a first terminal 126 of the clamp transistor 110. In a particular embodiment, the first terminal 126 is a drain terminal of the clamp transistor 110.

The clamp transistor 110 is configured to clamp a voltage applied to a resistance based memory element during a sensing operation. A resistance based memory element is a device having a first resistance corresponding to a logic "one" value and a second resistance corresponding to a logic "zero" value. An example of a resistance based memory element is a magnetic tunnel junction (MTJ) device. The clamp transistor 110 is configured to clamp a voltage applied to the memory cell 112 within the memory array 111. In a particular embodiment, the clamp transistor 110 is an NMOS transistor.

In response to a second control signal, such as the boost signal 128 received at the gate of the boost PMOS transistor 108, the boost PMOS transistor 108 may be configured to precharge the output node 152 and to provide a current to the clamp transistor 110 prior to the sensing operation. The sensing operation may occur during a memory read.

The load PMOS transistor 104 provides a means for providing a load in response to a gate voltage, where the gate voltage is controlled via the output 120 of the NAND circuit 106 that includes the first input 121 and the second input 123. The second input 123 is coupled in a feedback arrangement to the source terminal 103 of the load PMOS transistor 104.

The sensing circuit 100 may be included within an apparatus that includes the clamp transistor 110 which provides a means for clamping a voltage applied to a resistance based memory element during a sensing operation. In a particular embodiment, the resistance based memory element is an MTJ element or a memory cell that contains an MTJ element. In a particular illustrative embodiment, the means for clamping is coupled to the means for providing the load. For example, the clamp transistor 110 is coupled to the load PMOS transistor 104 as shown in FIG. 1.

The sensing circuit 100 may be integrated within a semiconductor die. The semiconductor die may be included within an integrated circuit or similar semiconductor device. Such a semiconductor device may be incorporated within many electronic devices. For example, an electronic device that may include a semiconductor die may be selected from the group consisting of a set top box, a music player, a video player, an entertainment unit, a navigation device, a communications device, a personal digital assistant (PDA), a fixed location data unit, and a computer, into which any of the circuit elements shown in FIG. 1 may be integrated. For example, the load PMOS transistor 104 and the clamp NMOS transistor 110 may be transistors within an integrated circuit that is incorporated within an electronic device.

The circuit arrangement shown in FIG. 1 may beneficially compensate for current variation due to aspects such as process variation and other environmental factors. For example, if the drain current at the load PMOS transistor 104 increases, the source voltage of the load PMOS transistor 104 decreases due to the first PMOS 102. In addition, due to the feedback path from the source terminal 103 of the load PMOS 104 to the second input 123 of the NAND circuit 106, the gate voltage of the load PMOS transistor 104 increases, and a source-to-gate voltage ($V_{SG}$) of the load PMOS transistor 104 decreases. In particular, the NAND circuit 106 is responsive to the source terminal 103 of the load PMOS transistor 104, which provides a feedback path such that the gate voltage of the load PMOS transistor 104 increases in response to the increased drain current while the source to gate voltage $V_{SG}$ of the load PMOS transistor 104 decreases. Thus, the received current increase is advantageously suppressed by the feedback arrangement and the circuit structure as described.

In addition to suppressing changes in current, the sensing circuit 100 also provides a reduced output voltage variation in response to process variations or other environmental impact to the circuit. For example, the load PMOS transistor 104 has a larger output resistance due at least in part to the feedback path and the NAND circuit 106. Since the feedback arrangement increases the output resistance of the load PMOS transistor 104, sensing margin is enhanced. In addition, the boost PMOS transistor 108 in the sense amplifier 101 improves the sensing time of the sense amplifier 101 due to the current from the boost PMOS transistor 108 provided in response to the boost signal 128. Thus, both sensing margin and sensing time are improved. Accordingly, the sensing circuit 100 improves sensing margin by utilizing a degeneration PMOS 102 and by controlling a gate voltage of a load PMOS 104 by a feedback path and a NAND circuit 106, and in addition reduces sensing time with a boost PMOS transistor 108.

Figure 2:
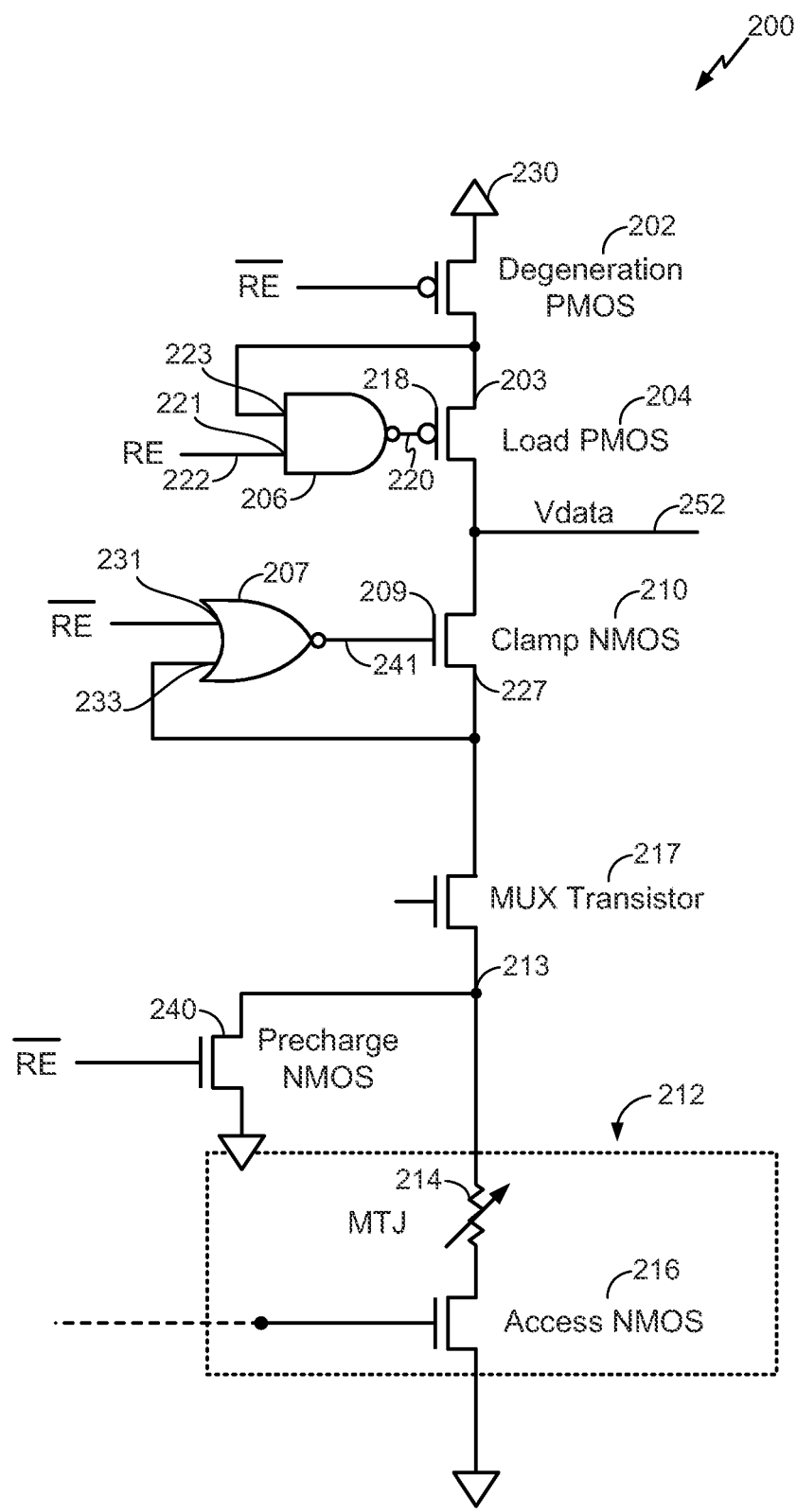
FIG. 2 is a diagram of a second illustrative embodiment of a sensing circuit.

Referring to FIG. 2, a diagram of a second illustrative embodiment of a sensing circuit is disclosed and generally designated 200. The sensing circuit 200 includes sense amplifier circuitry and a memory array. The memory array includes at least one memory cell having a resistance based memory element 212. The resistance based memory element 212 includes a magnetic funnel junction (MTJ) 214 and an access NMOS transistor 216.

The sense amplifier circuitry includes a voltage source 230, a degeneration PMOS transistor 202, a load PMOS transistor 204, a NAND circuit 206, a NOR circuit 207, an output node (Vdata) 252, and a clamp NMOS transistor 210. The sense amplifier circuit further includes a pre-charge NMOS transistor 240 and a multiplexor (MUX) transistor 217 coupling the sense amplifier circuitry to the resistance based memory element 212.

The load PMOS transistor 204 has a gate 218 responsive to an output 220 of the NAND circuit 206. The NAND circuit 206 includes a first input 221 responsive to a first control signal 222. The NAND circuit 206 further includes a second input 223 responsive to a terminal of the load PMOS transistor 204. In a particular embodiment, the second input 223 of the NAND circuit 206 is responsive to a source terminal 203 of the load PMOS transistor 204. The output 220 of the NAND circuit 206 drives the gate 218 of the load PMOS transistor 204. A drain terminal of the load PMOS transistor 204 is coupled to the output node 252 to provide voltage data to a second sense amplifier (not shown).

The clamp NMOS transistor 210 includes a gate 209 responsive to an output 241 from the NOR circuit 207. The clamp NMOS transistor 210 is configured to clamp a voltage applied to the resistance based memory element 212 during a sensing operation.

The NOR circuit 207 includes a first input 231 responsive to a second control signal and a second input 233 responsive to a feedback input coupled to a source terminal 227 of the clamp NMOS transistor 210. The feedback input of the NOR circuit 207 is also coupled to a drain terminal of the MUX transistor 217.

In a particular embodiment, the second control signal is an inversion of the first control signal, which is labeled RE. For example, the first control signal is labeled RE and the inverted control signal is labeled $\overline{RE}$.

The precharge NMOS transistor 240 is responsive to the second control signal $\overline{RE}$ and is coupled to an output of the MUX transistor 217. The precharge NMOS transistor 240 is configured to precharge the node 213. During operation, when the MIA transistor 217 turns on (e.g., a bit line is selected) an output voltage of the sensing circuit 200 initially abruptly drops to 0 volts (e.g., precharged bit line level) and increases after the bit line is charged by the load PMOS transistor 204 in response to the first control signal RE going high.

Figure 3:
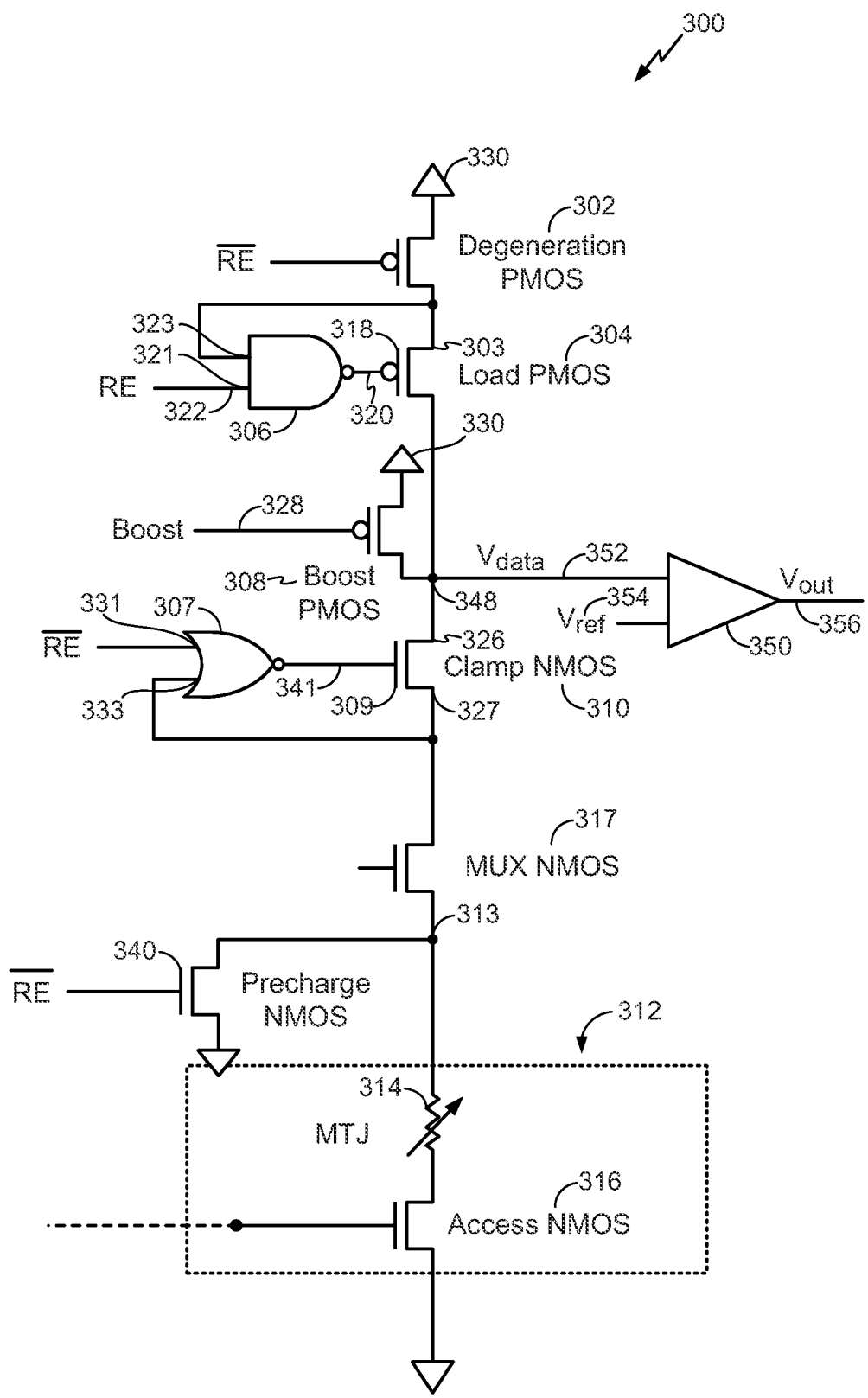
FIG. 3 is a diagram of third illustrative embodiment of a sensing circuit.

Referring to FIG. 3, a diagram of a third illustrative embodiment of a sensing circuit is disclosed and generally designated 300. The sensing circuit 300 includes many features of the sensing circuit 100 of FIG. 1 and the sensing circuit 200 of FIG. 2. In addition, the sensing circuit 300 includes an output stage responsive to a first voltage (Vdata) 352. The output stage includes a sense amplifier 350 including as a first input the first voltage Vdata 352 and including as a second input a second reference voltage (Vref) 354. In a particular embodiment, the second voltage 354 is a voltage derived from another sensing circuit having a similar structure to the sensing circuit 300. The output of the sense amplifier 350 includes an output voltage (Vout) 356 which provides an indication of a sensed output of the sensing circuit 300 as described in further detail below.

The other circuit elements of the sensing circuit 300 are similar in structure and operate similarly to the corresponding elements of the sensing circuit 100 of FIG. 1 and the sensing circuit 200 of FIG. 2. For example, the sensing circuit 300 includes a degeneration PMOS transistor 302, a load PMOS transistor 304, a NAND circuit 306, a boost PMOS transistor 308, a clamp NMOS transistor 310, a NOR circuit 307, a multiplexor (MUX) NMOS transistor 317, a precharge NMOS transistor 340, and a resistance based memory element 312. The resistance based memory element 312 includes a magnetic tunnel junction (MTJ) 314 and an access NMOS transistor 316.

The load PMOS transistor 304 has a gate 318 responsive to an output 320 of the NAND circuit 306. The NAND circuit 306 includes a first input 321 responsive to a control signal 322 and includes a second input 323 responsive to a feedback connection to a terminal 303 of the load PMOS transistor 304. In a particular embodiment, the terminal 303 is a source terminal of the load PMOS transistor 304. The source terminal 303 may also be coupled to a drain terminal of the degeneration PMOS transistor 302 which in turn is supplied by a voltage supply 330. The output 320 of the NAND circuit 306 drives the gate 318 of the load PMOS transistor 304.

The clamp NMOS transistor 310 includes a gate 309 responsive to an output 341 from the NOR circuit 307. The clamp NMOS transistor 310 is configured to clamp a voltage applied to the resistance based memory element 312 during a sensing operation.

The NOR circuit 307 includes a first input 331 responsive to a second control signal and includes a second input 333 responsive to a feedback connection to a second terminal 327 of the clamp NMOS transistor 310. In a particular embodiment, the second terminal 327 is a source terminal of the clamp NMOS transistor 310.

In a particular embodiment, the second control signal is an inversion of the first control signal, which is labeled RE. For example, the first control signal is labeled RE and the inverted control signal is labeled $\overline{RE}$.

The precharge NMOS transistor 340 is responsive to the second control signal $\overline{RE}$ and is coupled to an output of the MUX transistor 317. The precharge NMOS transistor 340 is configured to recharge the node 313. During operation, when the MUX transistor 317 turns on (e.g., a bit line is selected) the output voltage of the sensing circuit 300 initially abruptly drops to 0 volts (e.g., precharged bit line level) and increases after the bit line is charged. For example, the boost PMOS transistor 308 may be configured to precharge the output node 348 and to provide a current to the clamp transistor 310 prior to the sensing operation, thus reducing output voltage drop. The load PMOS transistor 304 may be turned on when the first control signal RE goes high. If the drain current at the load PMOS transistor 304 increases, the source voltage of the load PMOS transistor 304 decreases due to the degeneration PMOS 302. In addition, due to the feedback path from the source terminal 303 of the load PMOS 304 to the second input 323 of the NAND circuit 306, the gate voltage of the load PMOS transistor 304 increases, and a source-to-gate voltage ($V_{SG}$) of the load PMOS transistor 304 decreases. During the sensing operation, the boost PMOS transistor 308 is turned off in response to the boost signal 328 because the boost current would reduce sensing margin by increasing the output voltage of the sensing circuit 300 if the boost PMOS transistor 308 remained on during the sensing operation.

The NAND circuit 306 is similar in structure and operation to the NAND circuit 106 of FIG. 1, and the NOR circuit 307 is similar in structure and operation to the NOR circuit 207 of FIG. 2. In addition, the precharge NMOS transistor 340 is similar in structure and operation to the precharge NMOS transistor 240 of FIG. 2 and the MUX transistor 317 is similar in structure and operation to the MUX transistor 217 of FIG. 2. Each of the boost PMOS transistor 308, the clamp NMOS transistor 310, the precharge NMOS transistor 340, the load PMOS transistor 304, and the degeneration PMOS transistor 302 as described above performs similarly in operation as the corresponding transistors in the sensing circuits 100 and 200 of FIGS. 1 and 2 as described herein.

During operation, the sensing circuit 300 operates in one of two primary states: a logic 1 state indicating a logic 1 value stored at the resistance based memory element 312 and a logic 0 state indicating a logic 0 value stored at the resistance based memory element 312. For example, if the voltage Vdata 352 is greater than the reference voltage Vref 354, the sense amplifier 350 may provide a high value at its output 356 indicating the logic 1 state (or a logic high state). Alternatively, if the voltage Vdata 352 is lower than the reference voltage Vref 354, the sense amplifier 350 may provide a low value at its output 356 indicating the logic 0 state (or a logic low state). As such, the relative voltages between the voltage Vdata 352 and the reference voltage Vref 354 as detected by the sense amplifier 350 provides an indication of the sensed output of the sensing circuit 300. Thus, if a relative difference between the voltage Vdata 352 and the reference voltage Vref 354 is increased, a greater sense margin to detect a logic 0 or a logic 1 condition with respect to the sense amplifier 350 may be provided. Thus, the sensing circuit 300 includes the benefits of increased tolerance to process variations, increased sensing time, and increased sensing margin described herein.

Figure 4:
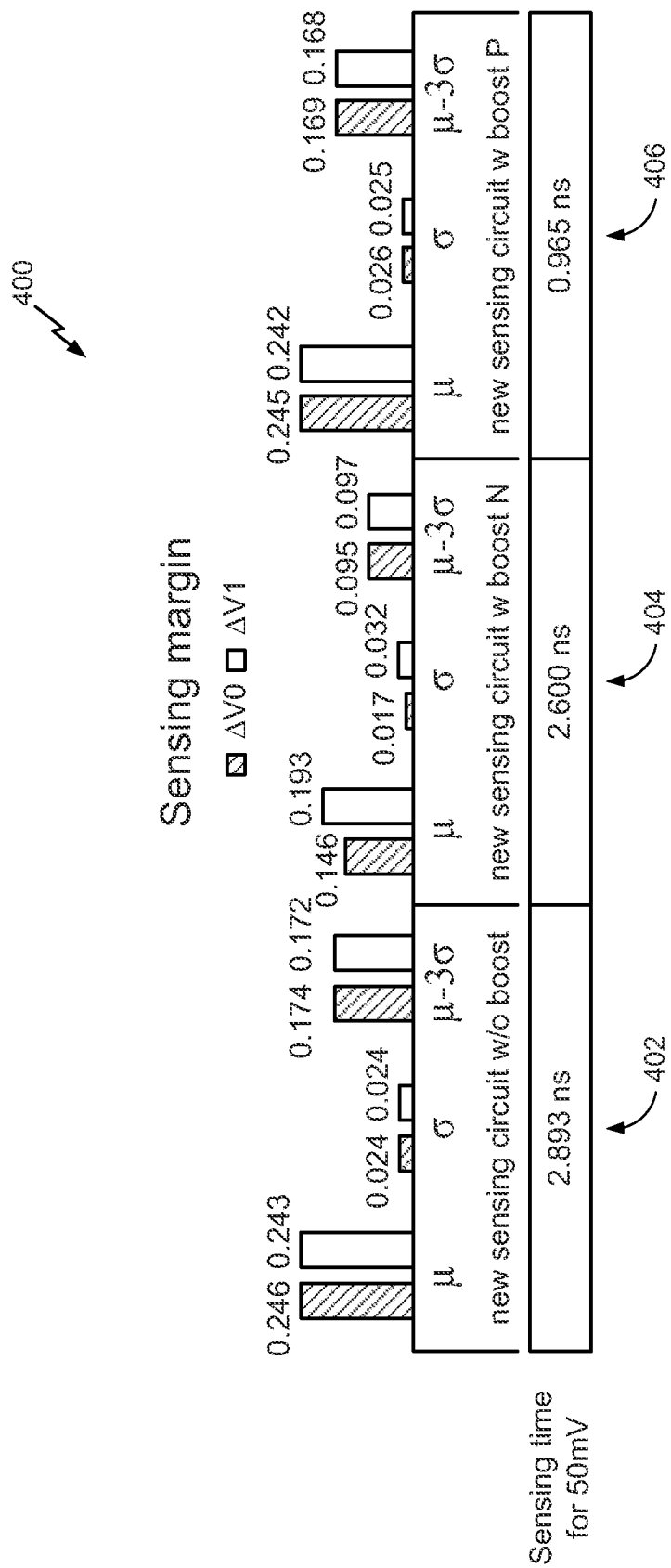
FIG. 4 is a graphical diagram illustrating simulation results for a first sense margin, a second sense margin, and a sensing time for different types of sensing circuits.

Referring to FIG. 4, a graphical illustration 400 of simulation results for a first sense margin ($\Delta V_0$), a second sense margin ($\Delta V_1$), and a sensing time are shown for different types of sensing circuits including a graphical illustration of a sensing circuit with a NAND circuit including a feedback path without a boost transistor 402, a graphical illustration of a sensing circuit with a NAND circuit including a feedback path and with an NMOS boost transistor 404, and a graphical illustration of a sensing circuit with a NAND circuit including a feedback path and with a PMOS boost transistor 406. A signal margin $\Delta V$, such as a sense amplifier margin, may correspond to a difference between a voltage $V_1$ and a voltage Vref ($\Delta V_1$) or a difference between a voltage Vref and a voltage $V_0$ ($\Delta V_0$). Statistical analysis may be applied to address process variations which tend to increase with technology scaling. Statistical analysis may report mean (i.e., average) and sigma (i.e., standard deviation) values of measured variables $\Delta V_0$ and $\Delta V_1$. A designer may take (mean–N*sigma) of $\Delta V_0$ and $\Delta V_1$ as a representative statistical value, where the value of N is chosen to achieve a desired yield. By improving signal margin $\Delta V$, memory device yield may be improved.

For example, the sensing circuit with a NAND circuit including a feedback path and without a boost transistor includes $\Delta V_0$=0.246V and $\Delta V_1$=0.243V as mean values, 0.024V for $\Delta V_0$ and 0.024V for $\Delta V_1$ as standard deviation values, and a sensing time=2.893 ns for a 50 mV threshold voltage. The sensing circuit with a NAND circuit including a feedback path and with an NMOS boost transistor includes $\Delta V_0$=0.146V and $\Delta V_1$=0.193V as mean values, 0.017V for $\Delta V_0$ and 0.032V for $\Delta V_1$ as standard deviation values, and a sensing time=2,600 ns for a 50 mV threshold voltage. The sensing circuit with a NAND circuit including a feedback path and with a PMOS boost transistor includes $\Delta V_0$=0.245V and $\Delta V_1$=0.242V as mean values, 0.026V for $\Delta V_0$ and 0.025V for $\Delta V_1$ as standard deviation values, and a sensing time=0.965 ns for a 50 mV threshold voltage.

Thus, a sensing circuit with an NMOS boost transistor and a feedback path for controlling a gate voltage of a load transistor slightly reduces sensing time while also degrading sensing margin as compared to a sensing circuit without a boost transistor, while a sensing circuit with a PMOS boost transistor and a NAND circuit including a feedback path for controlling a gate voltage of a load transistor significantly reduces sensing time without sensing margin degradation as compared to a sensing circuit without a boost transistor. Because the feedback arrangement increases output resistance of the load PMOS transistor, sensing margin is increased. In addition, the boost transistor improves the sensing time.

Figure 5:
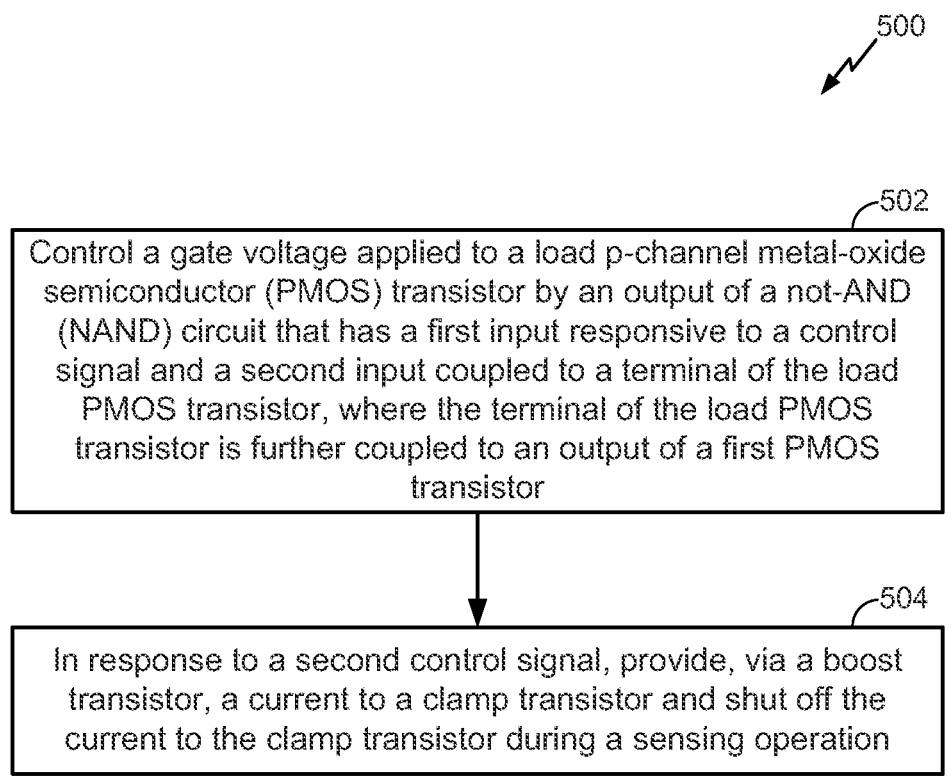
FIG. 5 is a flow diagram of an illustrative embodiment of a method of operation of a sensing circuit.

Referring to FIG. 5, a flow diagram of an illustrative embodiment of a method of operation of a sensing circuit is disclosed and generally designated 500. The method may be performed by a sensing circuit, such as the sensing circuit 100 of FIG. 1, the sensing circuit 200 of FIG. 2, or the sensing circuit 300 of FIG. 3.

The method 500 includes controlling a gate voltage applied to a load PMOS transistor by an output of a NAND circuit that has a first input responsive to a control signal and a second input coupled to a terminal of the load PMOS transistor, as shown at 502. For example, in FIG. 1, the terminal 103 of the load PMOS transistor 104 is coupled to an output of the degeneration PMOS transistor 102. As another example, the gate voltage applied to the load PMOS transistor 104 is controlled by an output 120 of the NAND circuit 106, and the NAND circuit 106 has a first input 121 responsive to a control signal (RE) and a second input 123 coupled to the terminal 103 of the load PMOS transistor 104.

The method further includes in response to a second control signal, providing via a boost transistor, a current to a clamp transistor and shutting off the current to the clamp transistor during a sensing operation, at 504. For example, in response to the boost signal 128, the boost PMOS transistor 108 may provide a current to the clamp transistor 110 and the boost PMOS transistor 108 may shut off the current to the clamp transistor 110 during a sensing operation.

By utilizing a degeneration PMOS and by controlling a gate voltage of a load PMOS by a feedback path and a NAND circuit, sensing margin may be increased. By utilizing a boost transistor, sensing time may be enhanced.

Figure 6:
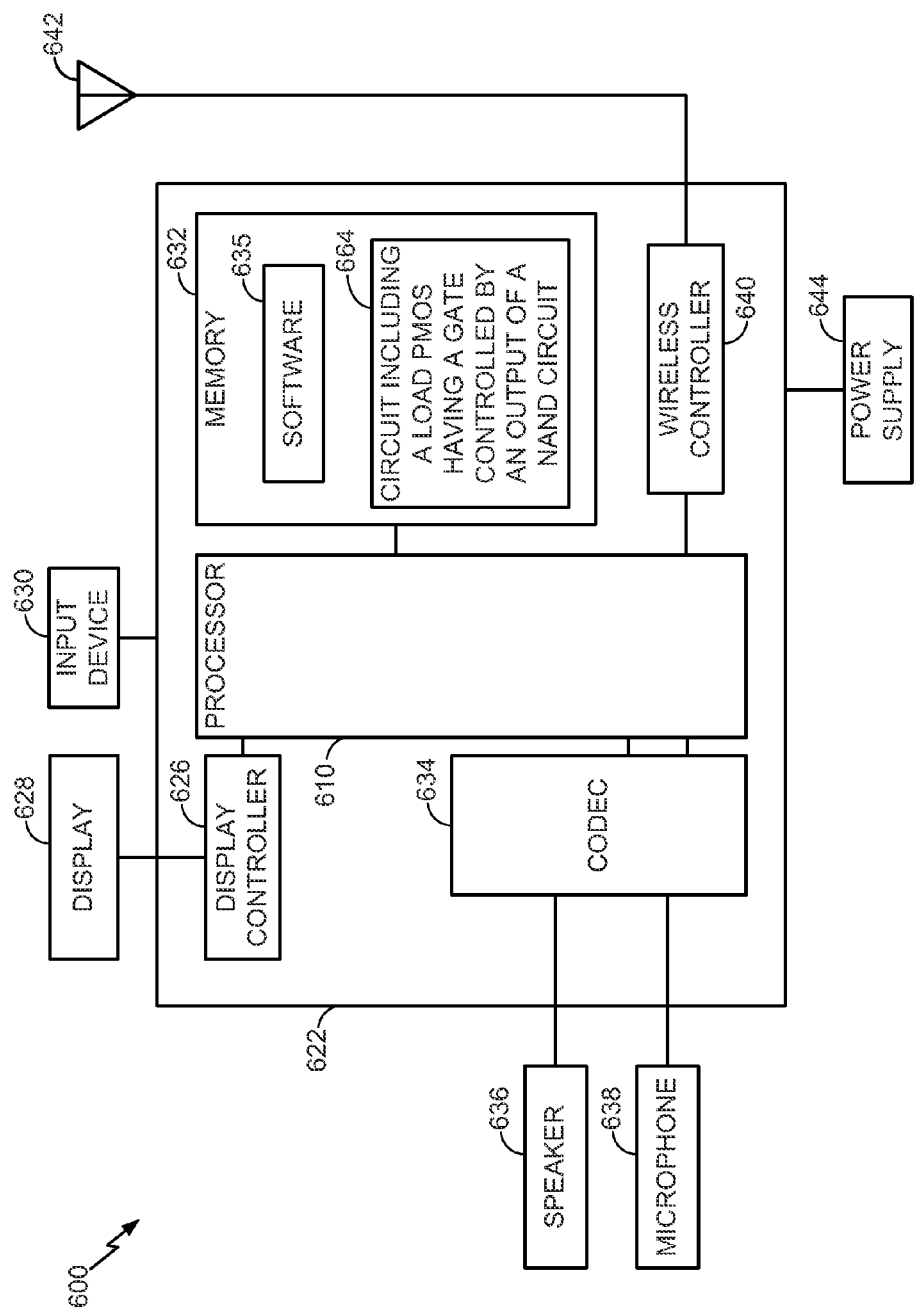
FIG. 6 is an illustrative embodiment of an electronic device that includes a load PMOS having a gate controlled by an output of a NAND circuit.

Referring to FIG. 6, a block diagram of a particular illustrative embodiment of an electronic device including a circuit 664 including a load PMOS having a gate controlled by an output of a NAND circuit is depicted and designated 600. The device 600 may be an electronic device such as a Personal Digital Assistant (PDA), a wireless mobile device, a computing device, another type of device, or any combination thereof. The device 600 includes a processor 610 such as a digital signal processor (DSP). The processor 610 is coupled to a memory 632 that may include the circuit 664 including a load PMOS having a gate controlled by an output of a NAND circuit. For example, the circuit 664 may be the sensing circuit 100 of FIG. 1, the sensing circuit 200 of FIG. 2, the sensing circuit 300 of FIG. 3, or any combination thereof. The memory 632 may be a non-transient computer-readable medium storing processor instructions such as software 635 that is executable to cause the processor 610 to perform any of the methods described herein to control operation of the circuit 664. For example, the instructions may include instructions to control a gate voltage applied to a load p-channel metal-oxide semiconductor (PMOS) transistor by an output of a NAND circuit that has a first input responsive to a control signal and a second input coupled to a source of the load PMOS transistor, where the source of the load PMOS transistor is further coupled to an output of a degeneration PMOS transistor. In a particular embodiment, the processor 610 may be integrated into the electronic device 600.

A coder-decoder (CODEC) 634, a display controller 626, and a wireless controller 640 are coupled to the processor 610. The display controller 626 is coupled to a display 628. A speaker 636 and a microphone 604 can be coupled to the CODEC 634.

The wireless controller 640 can be coupled to a wireless antenna 642. In a particular embodiment, the processor 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 604, the wireless antenna 642, and the power supply 644 are external to the system-on-chip device 622. However, each of the display 628, the input device 630, the speaker 636, the microphone 604, the wireless antenna 642, and the power supply 644 can be coupled to a component of the system-on-chip device 622, such as an interface or a controller.

Figure 7:
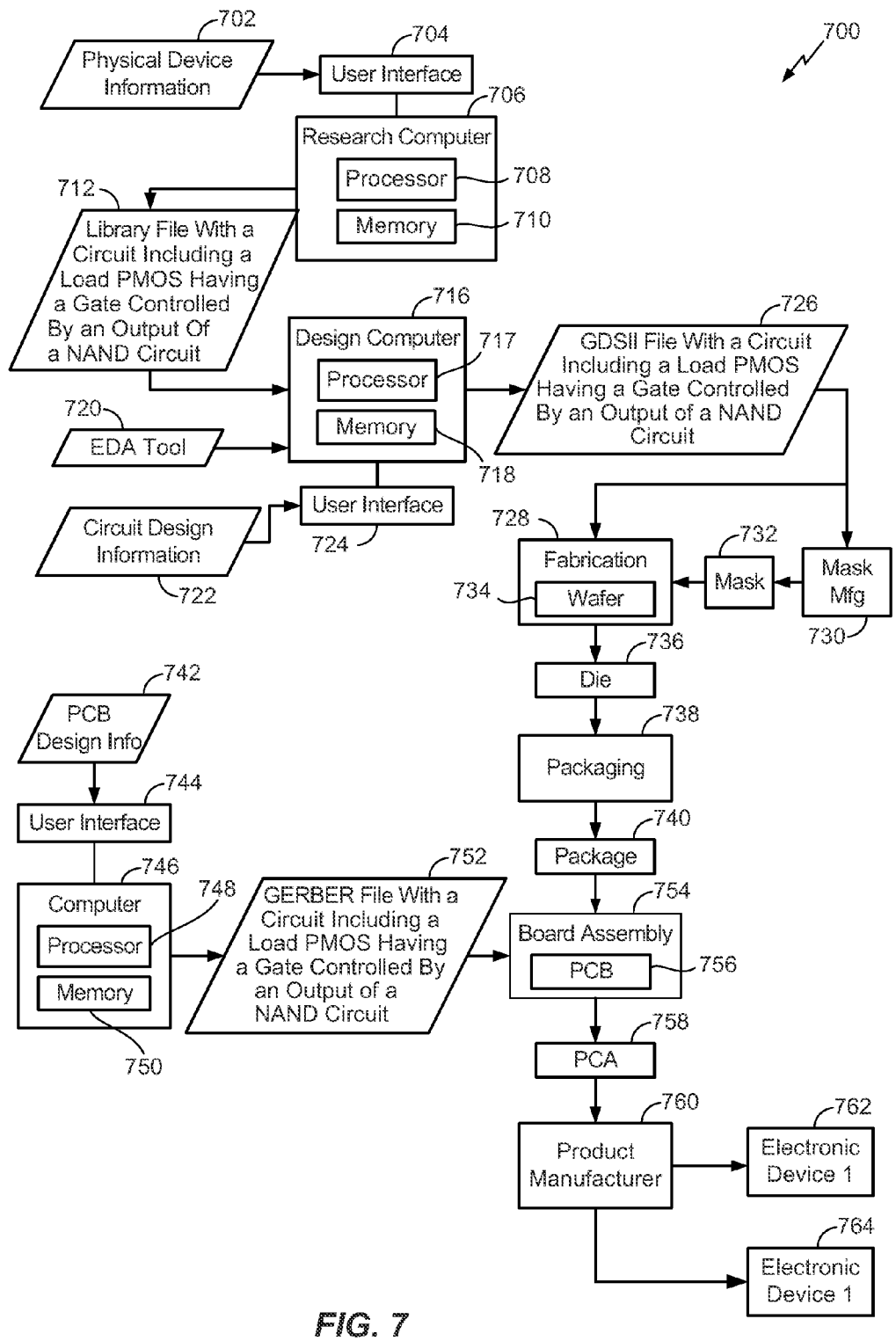
FIG. 7 is an illustrative embodiment of a method of manufacturing an integrated circuit device that includes a load PMOS having a gate controlled by an output of a NAND circuit.

FIG. 7 is a data flow diagram of a particular illustrative embodiment of a manufacturing process to manufacture electronic devices that include a sensing circuit (e.g., a sensing circuit including a load PMOS having a gate controlled by an output of a NAND circuit as illustrated in FIGS. 1-3).

The foregoing disclosed devices and functionalities may be designed and configured into computer files (e.g. RTL, GDSII, GERBER, etc.) stored on computer readable media. Some or all such files may be provided, to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received in the manufacturing process 700, such as at a research computer 706. The physical device information 702 may include design information representing at least one physical property of a semiconductor device, such as the sensing circuit 100 of FIG. 1, the sensing circuit 200 of FIG. 2, the sensing circuit 300 of FIG. 3, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the sensing circuit 100 of FIG. 1, the sensing circuit 200 of FIG. 2, the sensing circuit 300 of FIG. 3, or any combination thereof, that is provided for use with an electronic design automation (EDA) tool 720.

The library file 712 may be used in conjunction with the EDA tool 720 at a design computer 714 including a processor 717, such as one or more processing cores, coupled to a memory 718. The EDA tool 720 may be stored as processor executable instructions at the memory 718 to enable a user of the design computer 714 to design a system using a sensing circuit of the library file 712. For example, a user of the design computer 714 may enter circuit design information 722 via a user interface 724 coupled to the design computer 714. The circuit design information 722 may include design information representing at least one physical property of a semiconductor device, such as the sensing circuit 100 of FIG. 1, the sensing circuit 200 of FIG. 2, the sensing circuit 300 of FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file format may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 727 that includes information describing the sensing circuit 100 of FIG. 1, the sensing circuit 200 of FIG. 2, the sensing circuit 300 of FIG. 3, or any combination thereof, in addition to other circuits or information. To illustrate, the data file may include information corresponding to a system-on-chip (SOC) that includes the sensing circuit 100 of FIG. 1, the sensing circuit 200 of FIG. 2, the sensing circuit 300 of FIG. 3, or any combination thereof, and that also includes additional electronic circuits and components within the SOC.

The GDSII file 726 may be received at a fabrication process 728 to manufacture the sensing circuit 100 of FIG. 1, the sensing circuit 200 of FIG. 2, the sensing circuit 300 of FIG. 3, or any combination thereof according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, which may be tested and separated into dies, such as a representative die 736. The die 736 includes a sensing circuit, such as the sensing circuit 100 of FIG. 1, the sensing circuit 200 of FIG. 2, the sensing circuit 300 of FIG. 3, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 710. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 and includes a sensing circuit, such as the sensing circuit 100 of FIG. 1, the sensing circuit 200 of FIG. 2, the sensing circuit 300 of FIG. 3, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the sensing circuit. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a represented printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Embodiments of the disclosure may be suitably employed in any device which includes active integrated circuitry including memory and on-chip circuitry.

Thus, the sensing circuit 100 of FIG. 1, the sensing circuit 200 of FIG. 2, the sensing circuit 300 of FIG. 3, or any combination thereof may be fabricated, processed, and incorporated into an electronic device, as described in the illustrative process 700. One or more aspects of the embodiments disclosed with respect to FIGS. 1-3 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a non-transitory storage medium such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
   a degeneration p-channel metal-oxide-semiconductor (PMOS) transistor;
   a load PMOS transistor; and
   a clamp transistor configured to clamp a voltage applied to a resistance based memory element during a sensing operation,
   wherein a gate of the load PMOS transistor is controlled by an output of a not-AND (NAND) circuit having a first input responsive to a control signal and a second input coupled to a terminal of the load PMOS transistor.

2. The circuit of claim 1, wherein the terminal of the PMOS transistor is a source terminal.

3. The circuit of claim 1, further comprising a boost transistor coupled between a voltage supply and a first terminal of the clamp transistor.

4. The circuit of claim 3, wherein the first terminal of the clamp transistor is a drain terminal.

5. The circuit of claim 3, wherein in response to a second control signal, the boost PMOS transistor is configured to provide a current to the clamp transistor, and to shut off the current to the clamp transistor during the sensing operation.

6. The circuit of claim 3, further comprising a sense amplifier having an input coupled to an output of the boost transistor.

7. The circuit of claim 1, wherein the clamp transistor has a gate responsive to an output of a not-OR (NOR) circuit, and wherein the NOR circuit has a first input responsive to a second control signal and a second input coupled to a second terminal of the clamp transistor.

8. The circuit of claim 7, wherein the second terminal of the clamp transistor is a source terminal.

9. The circuit of claim 1, wherein the clamp transistor is coupled to a multiplexor (MUX) n-channel metal-oxide semiconductor (NMOS) transistor.

10. The circuit of claim 9, wherein a precharge NMOS transistor is coupled to an output of the MUX NMOS transistor.

11. The circuit of claim 1, wherein the resistance-based memory element comprises a magnetic tunnel junction (MTJ) element that is serially coupled to an access NMOS transistor within a memory cell.

12. The circuit of claim 1, integrated in at least one semiconductor die.

13. The circuit of claim 1, further comprising a device selected from the group consisting of a set top box, a music player, a video player, an entertainment unit, a navigation device, a communications device, a personal digital assistant (PDA), fixed location data unit, and a computer, into which the transistors of the circuit are integrated.

14. A method comprising:
   controlling a gate voltage applied to a load p-channel metal-oxide semiconductor (PMOS) transistor by an output of a not-AND (NAND) circuit that has a first input responsive to a control signal and a second input coupled to a terminal of the load PMOS transistor, wherein the terminal of the load PMOS transistor is further coupled to an output of a degeneration PMOS transistor; and
   in response to a second control signal:
      providing, via a boost transistor, a current to a clamp transistor; and
      shutting off the current to the clamp transistor during a sensing operation.

15. The method of claim 14, wherein the terminal of the load transistor is a source terminal.

16. The method of claim 14, wherein controlling the gate voltage is performed at a processor integrated into an electronic device.

17. An apparatus comprising:
   means for providing a load in response to a gate voltage, the gate voltage controlled, via an output of a not-AND (NAND) circuit comprising a first input responsive to a control signal and a second input coupled to a terminal of the means for providing the load; and
   means for clamping a voltage applied to a resistance-based memory element during a sensing operation, wherein the means for clamping is coupled to the means for providing the load.

18. The apparatus of claim 17, further comprising, in response to a second control signal, means for providing a current to a clamp transistor via boost transistor.

19. The apparatus of claim 17, wherein the terminal is a source terminal.

20. The apparatus of claim 17, integrated into at least one semiconductor die.

21. The apparatus of claim 17, further comprising a device selected from the group consisting of a set top box, a music player, a video player, an entertainment unit, a navigation device, a communications device, a personal digital assistant (PDA), a fixed location data unit, and a computer, into which the means for providing and the means for clamping are integrated.

22. A method comprising:
   a step for controlling a gate voltage applied to a load p-channel metal-oxide semiconductor (PMOS) transistor by an output of a not-AND (NAND) circuit that has a first input responsive to a control signal and a second input coupled to a terminal of the load PMOS transistor, wherein the terminal of the load PMOS transistor is further coupled to an output of a degeneration PMOS transistor; and
   in response to a second control signal:
      a step for providing, via a boost transistor, a current to a clamp transistor; and
      a step thr shutting off the current to the clamp transistor during a sensing operation.

23. The method of claim 22, wherein the terminal of the load PMOS transistor is a source terminal.

24. The method of claim 22, wherein the step for controlling, the step for providing, and the step for shutting off are performed by a processor integrated into an electronic device.

25. A computer readable tangible medium storing instructions executable by a processor to:
   control a gate voltage applied to a load p-channel metal-oxide semiconductor (PMOS) transistor by an output of a not-AND (NAND) circuit that has a first input responsive to a control signal and a second input coupled to a source of the load PMOS transistor, wherein the source of the load PMOS transistor is further coupled to an output of a degeneration PMOS transistor.

26. The computer readable tangible medium of claim 25, further comprising instructions executable by the processor to, in response to a second control signal:
   provide, via a boost transistor, a current to a clamp transistor; and
   shut off the current to the clamp transistor during a sensing operation.

27. The computer readable tangible medium of claim 26, wherein the processor is integrated in a device selected from the group consisting of a set top box, a music player, a video player, an entertainment unit, a navigation device, a communications device, a personal digital assistant (PDA), a fixed location data unit, and a computer.

28. A method comprising:
   receiving design information representing at least one physical property of a semiconductor device, the semiconductor device comprising:
      a degeneration p-channel metal-oxide-semiconductor (PMOS) transistor;
      a load PMOS transistor; and
      a clamp transistor configured to clamp a voltage applied to a resistance based memory element during a sensing operation,
      wherein a gate of the load PMOS transistor is controlled by an output of a not-AND (NAND) circuit having a first input responsive to a control signal and having a second input coupled to a source of the load PMOS transistor;
   transforming the design information to comply with a file format; and
   generating a data file comprising the transformed design information.

29. The method of claim 28, wherein the data file comprises a GDSII format.

30. The method of claim 28, wherein the data file comprises a GERBER format.

31. A method comprising:
   receiving a data file comprising design information corresponding to a semiconductor device; and
   fabricating the semiconductor device according to the design information, wherein the semiconductor device comprises:
      a degeneration p-channel metal-oxide-semiconductor (PMOS) transistor;
      a load PMOS transistor; and
      a clamp transistor configured to clamp a voltage applied to a resistance based memory element during a sensing operation,
      wherein a gate of the load PMOS transistor is controlled by an output of a not-AND (NAND) circuit having a first input responsive to a control signal and a second input coupled to a terminal of the load PMOS transistor.

32. The method of claim 31, wherein the data file has a GDSII format.

33. The method of claim 31, wherein the data file has a GERBER format.

* * * * *